(12) United States Patent
Turner et al.

(10) Patent No.: US 8,030,173 B2
(45) Date of Patent: Oct. 4, 2011

(54) SILICON NITRIDE HARDSTOP ENCAPSULATION LAYER FOR STI REGION

(75) Inventors: Michael D. Turner, Poughkeepsie, NY (US); Christopher J. Rando, Wappingers Falls, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 151 days.

(21) Appl. No.: 12/475,056

(22) Filed: May 29, 2009

(65) Prior Publication Data
US 2010/0304548 A1  Dec. 2, 2010

(51) Int. Cl.
*H01L 21/76* (2006.01)
*H01L 21/336* (2006.01)

(52) U.S. Cl. ......... 438/435; 438/424; 438/427; 438/296

(58) Field of Classification Search .................. 438/435, 438/424, 427, 207, 218, 219, 221, 294, 353, 438/355, 425, 591
See application file for complete search history.

(56) References Cited

U.S. PATENT DOCUMENTS

| | | |
|---|---|---|
| 5,940,716 A | 8/1999 | Jin et al. |
| 5,950,090 A | 9/1999 | Chen et al. |
| 6,001,708 A | 12/1999 | Liu et al. |
| 6,171,929 B1 | 1/2001 | Yang et al. |
| 6,271,143 B1 | 8/2001 | Mendicino |
| 6,297,126 B1 | 10/2001 | Lim et al. |
| 6,316,311 B1 | 11/2001 | Chen et al. |
| 6,350,661 B2 | 2/2002 | Lim et al. |
| 6,406,975 B1 | 6/2002 | Lim et al. |
| 6,500,728 B1 | 12/2002 | Wang |
| 6,645,808 B1 | 11/2003 | Tsai |
| 6,645,867 B2 * | 11/2003 | Dokumaci et al. ............ 438/700 |
| 6,791,190 B1 | 9/2004 | Chung |
| 6,828,208 B2 | 12/2004 | Lin et al. |
| 7,015,534 B2 * | 3/2006 | Colombo ....................... 257/314 |
| 7,029,987 B2 * | 4/2006 | Kim .............................. 438/424 |
| 7,141,485 B2 | 11/2006 | Su et al. |
| 7,265,014 B1 | 9/2007 | Hui et al. |
| 7,342,284 B2 | 3/2008 | Ting et al. |
| 2007/0249160 A1 | 10/2007 | Turner et al. |

* cited by examiner

*Primary Examiner* — Chuong A. Luu
(74) *Attorney, Agent, or Firm* — Hamilton & Terrile, LLP; Michael Rocco Cannatti (57) ABSTRACT

A semiconductor process and apparatus provides an encapsulated shallow trench isolation region by forming a silicon nitride layer (96) to cover a shallow trench isolation region (95), depositing a protective dielectric layer (97, 98) over the silicon nitride layer (96), and polishing and densifying the protective dielectric layer (97, 98) to thereby form a densified silicon nitride encapsulation layer (99) over the shallow trench isolation region (95).

20 Claims, 6 Drawing Sheets

SILICON NITRIDE HARDSTOP ENCAPSULATION LAYER FOR STI REGION

BACKGROUND OF THE INVENTION

1. Field of the Invention

The present invention is directed in general to the field of semiconductor devices. In one aspect, the present invention relates to shallow trench isolation regions which electrically isolate semiconductor active regions.

2. Description of the Related Art

As device performance becomes more and more demanding, semiconductor devices are formed with shallow trench isolation ("STI") regions which form improved field isolation structures as compared to conventional local oxidation of silicon ("LOCOS") techniques. However, the dielectric material used to form isolation trench regions can be substantially eroded during post-trench processing of the active area (e.g., gate oxide and gate poly formation), resulting in divots and recesses in the STI regions that create adverse parasitic sidewall devices (e.g., an unwanted sidewall parasitic MOSFET) adjacent to the active areas of an integrated circuit (IC). In addition, divots and recesses formed in the STI regions can cause gate wrap around and gate oxide leakage. Another drawback with conventional STI regions is that oxygen diffusion from the STI regions can increase the threshold voltage of narrow width high-k gates which use $HfO_2$ gate dielectric layers.

Accordingly, a need exists for an improved shallow trench isolation region and associated semiconductor manufacturing process that address various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance semiconductor devices by forming a silicon nitride hardstop encapsulation layer over the shallow trench isolation region to prevent formation of divots and recesses and oxygen diffusion. As a preliminary matter, an initial SOI wafer semiconductor stack is formed which includes one or more pad oxide layers formed between the SOI semiconductor layer and a nitride mask layer. A trench opening is formed in the SOI wafer semiconductor stack using a patterned nitride mask layer, and a dielectric layer (such as high density plasma oxide) is deposited to at least partially fill the trench opening. A hardstop encapsulation layer (e.g., silicon nitride) is then deposited over the dielectric layer in the trench opening, covered with a protective dielectric layer (e.g., high density plasma oxide), and densified before, during or after a chemical mechanical polish process to form a shallow trench isolation region having a silicon nitride hardstop encapsulation layer which prevents formation of divots and recesses in the STI and prevents oxygen diffusion from the STI regions. By encapsulating the silicon nitride hardstop layer in one or more dielectric materials, such as additional layers of silicon dioxide and/or silicon nitride, the silicon nitride hardstop layer is protected from post-polish processing. Thus, shallow trench isolation regions may be formed with a silicon nitride hardstop encapsulation layer that prevents trench fill erosion and divots so that the resulting structure can be substantially planarized with a CMP process to form one or more substrates on which semiconductor devices may be fabricated.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 1:
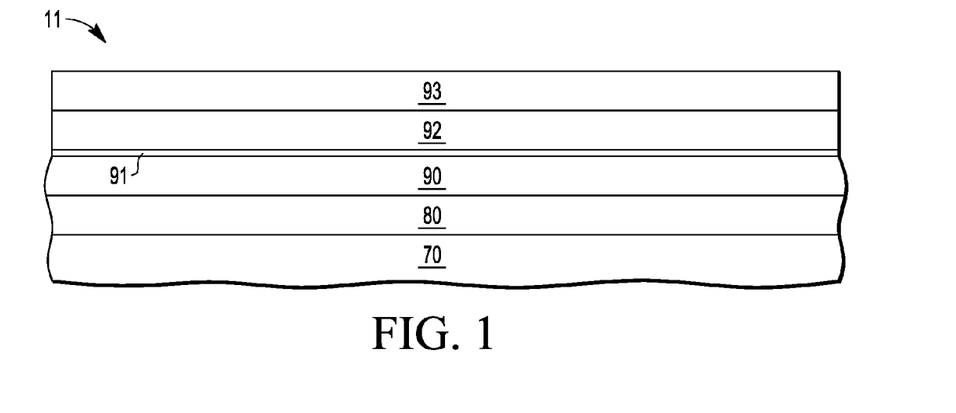
FIG. 1 is a partial cross-sectional view of a semiconductor wafer structure having semiconductor-on-insulator ("SOI") layers formed over a semiconductor substrate where a pad oxide layer, pad nitride mask layer, and etch mask layer are formed over the SOI semiconductor layer.

Turning now to FIG. 1, a partial cross-sectional view is illustrated of a semiconductor wafer structure 11 having a semiconductor layer 90 and insulator layer 80 located over a semiconductor substrate layer 70 to form semiconductor-on-insulator (SOI) layers 90, 80. On the SOI semiconductor layer 90, one or more oxide polish stop or pad layers 91 and a nitride mask pad layer 92 are formed. Specifically, the structure 11 includes a first semiconductor layer 70 formed of a semiconductor material which may have first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor layer 70 may be appropriately doped to provided n-type (electron) and p-type (hole) carriers.

The structure 11 also includes an insulator layer 80, also known as buried oxide (BOX) layer, which is formed on the first semiconductor substrate layer 70 (e.g., by depositing a dielectric layer, such as oxide) and which will ultimately be used to form the isolation layer for semiconductor-on-insulator devices. In addition, a second semiconductor layer 90 is formed on the insulator layer 80 and which will ultimately be used to form the semiconductor layer for semiconductor-on-insulator devices. Depending on the type of transistor device being fabricated, the second semiconductor layer 90 may be formed from any semiconductor material, including, for example, Si, SiC, SiGe, SiGeC, Ge, GaAs, InAs, InP as well as other III-V or II-VI compound semiconductors or any combination thereof. It will also be appreciated that the second semiconductor layer 90 may be appropriately doped to provided n-type (electron) and p-type (hole) carriers. The second semiconductor layer 90 may be formed with a semiconductor material having a second crystallographic orientation which is different from the first crystallographic orientation, though the first and second crystallographic orientations can also be the same. For example, when silicon is employed as the semiconductor material, electron mobility is higher on a (100) surface orientation, and hole mobility is higher on a (110) surface orientation provided that the channel direction is oriented in the <110> direction. In this case, the (100) Si surface is used as the substrate layer when forming bulk NMOS devices, while the (110) Si surface is used as the substrate layer when forming bulk PMOS devices.

Formed over the second or SOI semiconductor layer 90 is one or more relatively thin pad oxide layers 91. In various embodiments, the pad oxide layer 91 is formed having a thickness of roughly 20 Angstroms to 120 Angstroms, and more particularly approximately 50 Angstroms, though any desired thickness may be used. The first pad oxide layer 91 may be formed by thermally growing an oxide material (such as silicon dioxide, nitrided silicon oxide, metal oxide or multi-metal oxide) on the SOI semiconductor layer 90, though any desired technique may be used, such as chemical vapor deposition (CVD) techniques, physical vapor deposition (PVD) techniques, atomic layer deposition (ALD) techniques, or any other technique for depositing or growing an oxide layer 91.

After forming the first oxide layer 91, a first mask layer 92 is formed to a predetermined thickness over the underlying oxide layer(s) 91 with an appropriate masking materials, such as nitride. In various embodiments, the nitride mask layer 92 is formed to a thickness of between approximately 600-2500 Angstroms, and more particularly approximately 700-1000 Angstroms, though any desired thickness may be used. The nitride mask layer 92 may be formed by depositing a layer of silicon nitride, silicon oxynitride, silicon-rich variants thereof, composites of any of these materials, or some other appropriate masking material using any desired technique, such as PECVD, CVD, PVD, ALD, or the like.

Once the pad oxide layer(s) 91 and nitride mask layer 92 are formed, an etch mask layer 93 of photoresist or other etch mask material may be formed directly on the nitride mask layer using any desired technique, such as PECVD, CVD, PVD, ALD, or the like. In selected embodiments, the etch mask layer 93 is formed to a predetermined thickness that is selected to provide a photo etch protection property for any subsequent photo etch processes that are used to form any trench opening(s) in the semiconductor wafer structure 11. Though not shown, multi-layer masking techniques may also be used, such as by sequentially depositing or forming a first masking layer (such as an organic anti-reflective coating (ARC) layer), a second masking layer (such as a hardmask or TEOS layer) and a photoresist layer (not shown).

Figure 2:
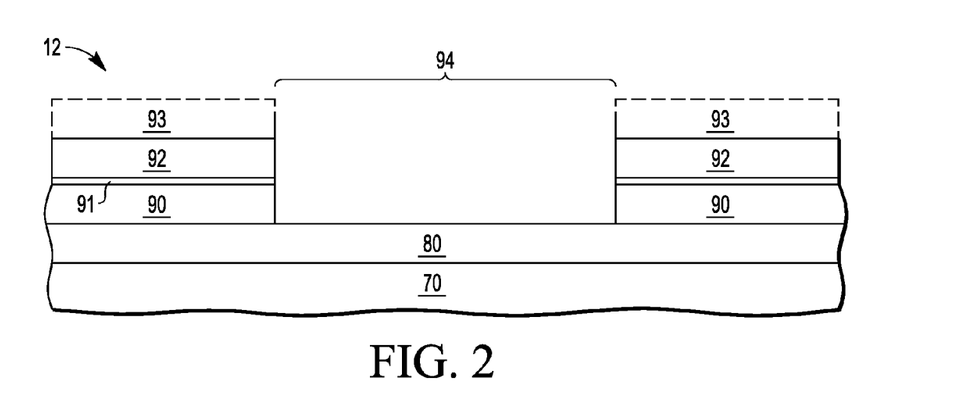
FIG. 2 illustrates processing subsequent to FIG. 1 after patterning the etch mask layer and etching a trench opening.

FIG. 2 illustrates processing of the semiconductor wafer structure 12 subsequent to FIG. 1 after patterning the etch mask layer 93 to define an area where a trench isolation structure is to be formed. For example, the patterned etch mask layer 93 may be formed from any appropriate photoresist material (e.g., 193 nm resist) that is patterned (e.g., using a 193 nm develop) and etched to form a resist pattern 93 over the underlying layers 90-92. The opening formed in the patterned etch mask layer 93 is extended through the pad oxide layer(s) 91, nitride mask layer 92, and the second semiconductor layer 90 (if not also the insulator layer 80) using any desired selective etch process. In selected embodiments, the patterned etch mask layer 93 is used to form a trench opening 94 by selectively etching down to at least the second semiconductor layer 90 using a combination of a nitride/oxide reactive ion etch (RIE) or like composite selective plasma operations. As indicated by the dashed lines, the patterned etch mask layer 93 may not be present through the entirety of the etch sequence, in which case, it will be appreciated that the trench etch process(es) may thin the nitride mask layer 92. In other embodiments, a nonselective etch may be used to trench through all or several of the layers 90-92. As formed, the trench opening 94 defines and differentiates active regions for first and second types of MOS devices subsequently formed on the wafer structure 12. For example, the unetched portions of the second semiconductor layer 90 define a first device region for a first type of MOS device, while the portions of the first semiconductor layer 70 that are exposed by the opening 94 and subsequently epitaxially re-grown define a second device region for a second type of MOS device. While the trench opening 94 is shown as being formed down to the insulator layer 80, it will be appreciated that the etch process used to form the trench opening 94 may etch down to the underlying substrate 70.

Figure 3:
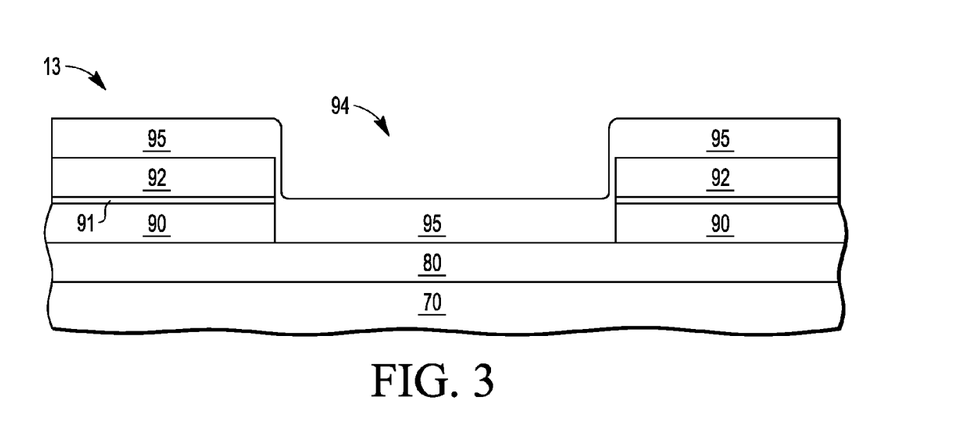
FIG. 3 illustrates processing subsequent to FIG. 2 after stripping the patterned etch mask layer and filling at least part of the trench opening with an insulator material.

FIG. 3 illustrates processing of the semiconductor wafer structure 13 subsequent to FIG. 2 after stripping the patterned etch mask layer 93 and filling at least part of the trench opening 94 with an insulator or dielectric layer 95. In particular, after the trench opening 94 is formed and the patterned photoresist/mask layer 93 is stripped (e.g., with an ash/piranha process), the trench opening 94 is at least partially filled with a deposited dielectric layer 95 (such as high density plasma oxide). While the dielectric layer 95 can be formed from one or more deposited dielectric layers with any desired insulator materials, a high density plasma oxide may be deposited to a predetermined minimum thickness, such as approximately 500-1000 Angstroms, and more particularly approximately 800 Angstroms, though other thicknesses can be used. The dielectric layer 95 should be sufficiently thick to at least partially fill the trench opening 94 so that it is at least substantially the same height as the second semiconductor layer 90, thereby completely covering the exposed sidewalls of the second semiconductor layer 90 (and any exposed portion of the first semiconductor substrate layer 70) to electrically isolate devices formed in the active device regions. As shown in FIG. 3, the dielectric layer 95 may be deposited as a non-conformal layer so that the dielectric layer 95 formed on vertical surfaces is thinner than the dielectric layer 95 formed on horizontal surfaces. Though not shown, a CMP process may be applied to polish the dielectric layer 95 from the top of the nitride mask layer 92.

Figure 4:
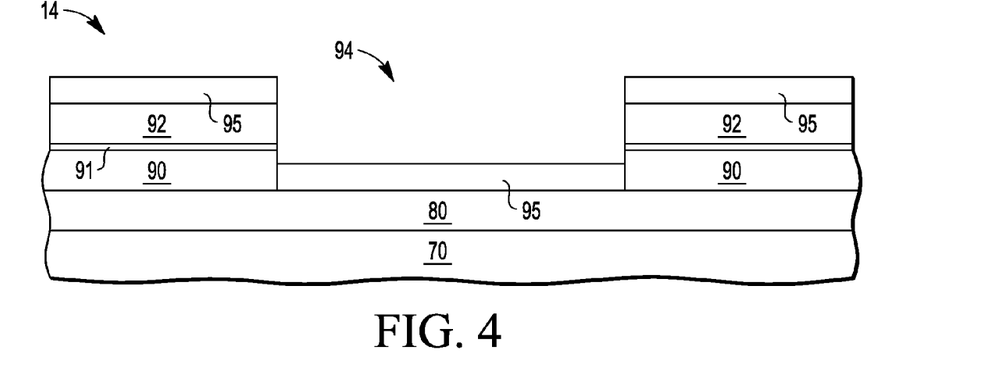
FIG. 4 illustrates processing subsequent to FIG. 3 after removing the insulator material from the exposed sidewalls of the trench opening.

FIG. 4 illustrates processing of the semiconductor wafer structure 14 subsequent to FIG. 3 after removing the portions of the dielectric layer 95 formed on the exposed sidewalls of the trench opening 94. While any desired removal process may be used, an isotropic or wet etch process may be employed by using hydrofluoric (HF) acid or another appropriate oxide etchant to clear the vertical sidewalls in the trench opening while leaving a thinner, though substantial, portion of the dielectric layer 95 at the bottom of the trench opening (and on top of the nitride mask layer 92). In selected embodiments, a 135A HF solution is applied to recess the dielectric layer 95, thereby clearing the exposed sidewalls of the trench opening 94.

Figure 5:
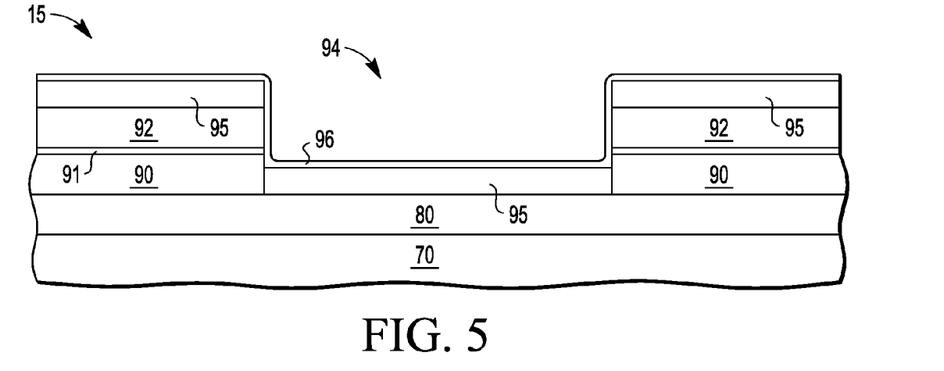
FIG. 5 illustrates processing subsequent to FIG. 4 after depositing a first silicon nitride layer over the semiconductor wafer structure.

FIG. 5 illustrates processing of the semiconductor wafer structure 15 subsequent to FIG. 4 after a hardstop encapsulation layer 96 is formed. The hardstop encapsulation layer 96 may be formed along the exposed side walls of trench opening 94 using any desired technique, such as PECVD, CVD, PVD, ALD, or the like. In selected embodiments, the hardstop encapsulation layer 96 may be formed using a PECVD process to deposit an undensified or tensile silicon nitride layer 96 to a predetermined minimum thickness, such as approximately 100-400 Angstroms, and more particularly approximately 200 Angstroms, though other thicknesses can be used. By controlling the thickness and placement of the silicon nitride layer 96 over the remaining portion of the dielectric layer 95 in the trench opening which forms the STI region, a hardstop encapsulation layer is formed which simultaneously protects the STI region 95 from erosion caused by subsequent processing, and also caps the STI region 95 against oxygen diffusion.

Figure 6:
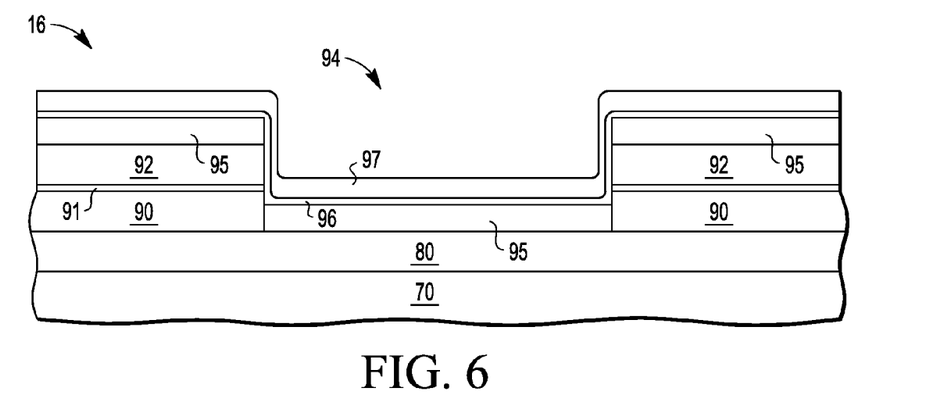
FIG. 6 illustrates processing subsequent to FIG. 5 after depositing a protective insulator material over the first silicon nitride layer.

FIG. 6 illustrates processing of the semiconductor wafer structure 16 subsequent to FIG. 5 after depositing a protective insulator layer 97 over the hardstop encapsulation layer 96. The protective insulator layer 97 may be formed along the exposed side walls of trench opening 94 using any desired technique, such as PECVD, CVD, PVD, ALD, or the like, and in selected embodiments, the protective insulator layer 97 is formed by depositing a thin high density plasma oxide layer 97 to a predetermined minimum thickness, such as approximately 100-200 Angstroms, and more particularly approximately 150 Angstroms, though other thicknesses can be used. In selected embodiments, the protective insulator layer 97 may be deposited as a non-conformal layer so that the protective insulator layer 97 is thicker over the hardstop encapsulation layer 96 at the bottom of the trench opening so as to protect the hardstop encapsulation layer 96 from subsequent processing.

Figure 7:
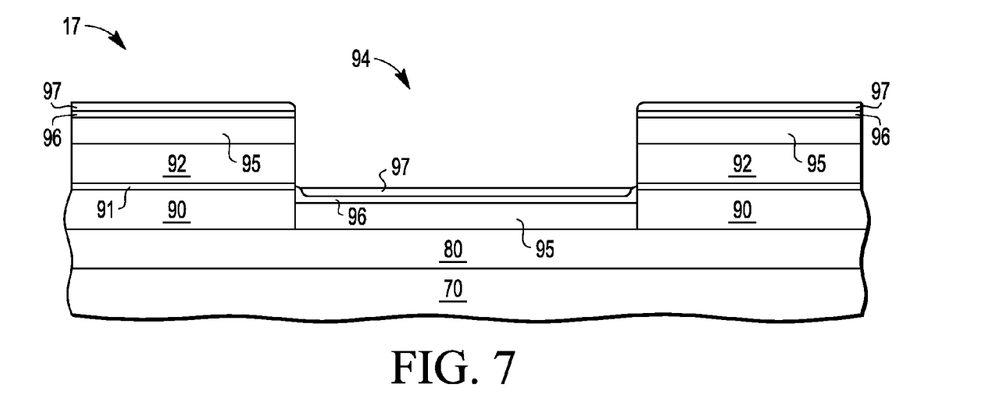
FIG. 7 illustrates processing subsequent to FIG. 6 after removing the protective insulator material and first silicon nitride layer from the exposed sidewalls of the trench opening.

FIG. 7 illustrates processing of the semiconductor wafer structure 17 subsequent to FIG. 6 after removing the protective insulator layer 97 and hardstop encapsulation layer 96 from the exposed sidewalls of the trench opening. While any desired removal process may be used, an isotropic or wet etch process may be employed by using hydrofluoric (HF) acid or another appropriate etchant to clear the SiN hardstop encapsulation layer 96 and protective (oxide) insulator layer 97 from the vertical sidewalls in the trench opening while leaving the encapsulation layer 96 and protective insulator layer 97 on the horizontal surfaces of the dielectric layer 95 (including at the bottom of the trench opening). In selected embodiments, a 135A HF solution is applied to which etches the undensified SiN encapsulation layer 96 and protective oxide layer 97, thereby clearing the exposed sidewalls of the trench opening 94 while leaving a portion of the protective oxide layer 97 at the bottom of the trench to protect the SiN encapsulation layer from etching.

Figure 8:
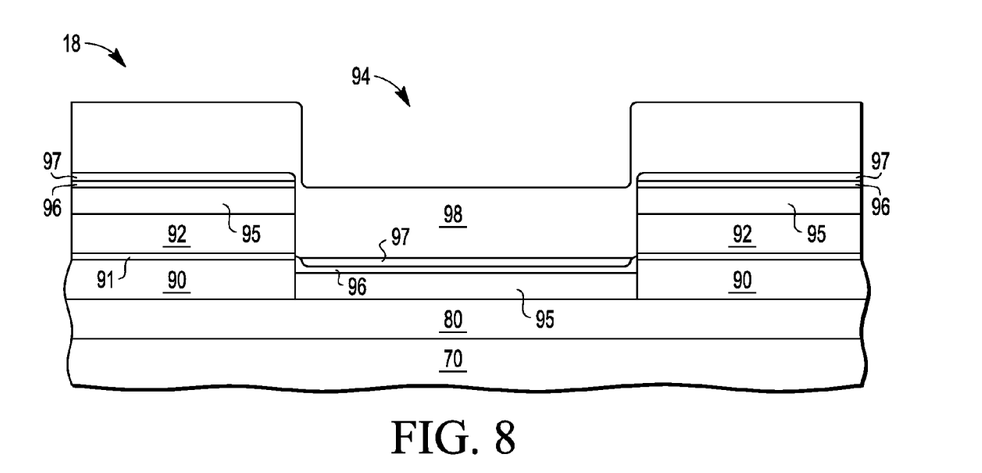
FIG. 8 illustrates processing subsequent to FIG. 7 after filling at least part of the remainder of the trench opening with an additional layer of the insulator material.

FIG. 8 illustrates processing of the semiconductor wafer structure 18 subsequent to FIG. 7 after filling at least part of the remainder of the trench opening 94 with an additional insulator or dielectric layer 98. As will be appreciated, the additional dielectric layer 98 can be formed from one or more deposited dielectric layers with any desired insulator materials, but in selected embodiments, a high density plasma oxide is deposited to a predetermined minimum thickness, such as approximately 1000-3000 Angstroms, and more particularly approximately 2000 Angstroms, though other thicknesses can be used. The additional dielectric layer 98 should be sufficiently thick to substantially fill the remainder of the trench opening 94. As shown in FIG. 8, the additional dielectric layer 98 may be deposited as a non-conformal layer which is thinner on the vertical surfaces than the horizontal surfaces.

Figure 9:
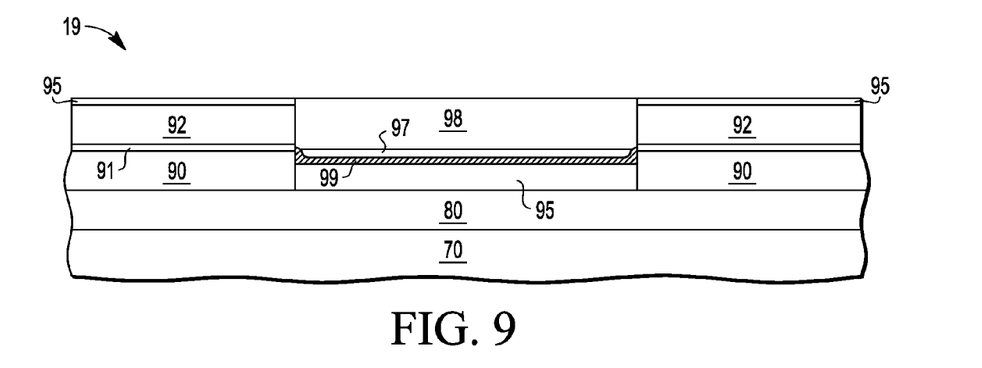
FIG. 9 illustrates processing subsequent to FIG. 8 after CMP polishing of the semiconductor wafer structure and densification of the first silicon nitride layer.

FIG. 9 illustrates processing of the semiconductor wafer structure 19 subsequent to FIG. 8 after a polish and/or etch of the additional dielectric layer 98 and densification of the SiN encapsulation layer 99. As will be appreciated, the densification process may precede the polish process so that the SiN encapsulation layer 99 is densified prior to CMP. In any case, the SiN encapsulation layer 99 may be thermally densified to reduce the N—H groups and generally becoming more tensile, depending on its starting strain. For example, a densification process may occur at temperatures generally starting above 900 degrees Celsius and up to at least 1200 degrees Celsius in a variety of ambient conditions, including but not limited to $N_2$, $O_2$, or $N_2H_2$. As a result of densification, the HF etch of the densified SiN layer is greatly reduced or eliminated as compared to SiN having higher levels of hydrogen. Chemical mechanical polishing or any desired etchant process may be used to polish the additional dielectric layer 98, including dry etching, wet etching or any other polish process. During the CMP polish process, all or part of the additional dielectric layer 98, protective oxide layer 97, undensified SiN encapsulation layer 96, and dielectric layer 95 may be removed from the top of the nitride mask pad layer 92. As shown, the upper surface of the additional dielectric layer 98 and dielectric layer 95 are polished to within 100 Angstroms of the nitride mask pad layer 92, though other thicknesses may be used, or the nitride mask pad layer 92 may serve as a polish stop layer for the CMP step. As illustrated, CMP process serves to densify the SiN hardcap encapsulation layer 99 that is formed over the STI region 95, and also leaves a portion encapsulation layer 99 of the additional dielectric layer 98 to embed or encapsulate the densified SiN hardcap.

At this point in the fabrication process, a shallow trench isolation region 95 is formed which includes a densified silicon nitride hardstop encapsulation layer 99 which will protect the STI region 95 against divots and recesses that would otherwise be formed by subsequent device processing, and prevent oxygen diffusion from the STI region 95 that could adversely affect subsequent fabrication processes, such as by increasing the threshold voltage of narrow width high-k gates which use $Hf0_2$ gate dielectric layers.

Figure 10:
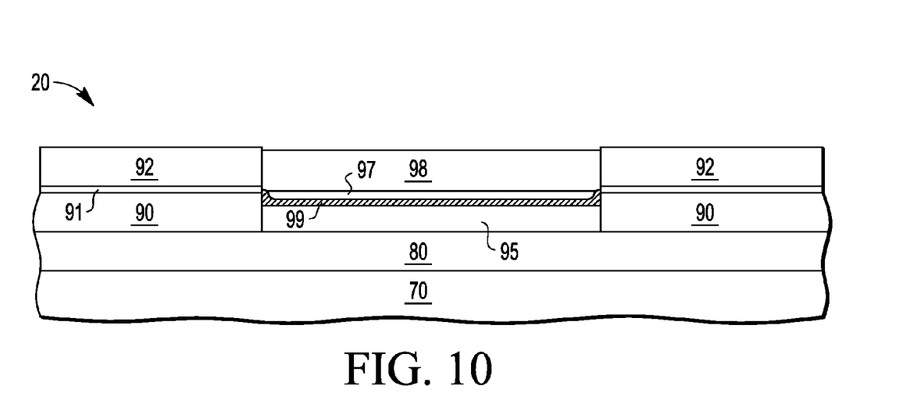
FIG. 10 illustrates processing subsequent to FIG. 9 after removing insulator material from the pad nitride mask layer.

FIG. 10 illustrates processing of the semiconductor wafer structure 20 subsequent to FIG. 9 after removing the remainder of the dielectric layer 95 from the top of the nitride mask pad layer 92. In selected embodiments, a deglazing process may be used to remove the dielectric layer 95, along with part of the additional dielectric layer 98 in the trench opening area, but any desired dielectric etch or polish process may be used.

Figure 11:
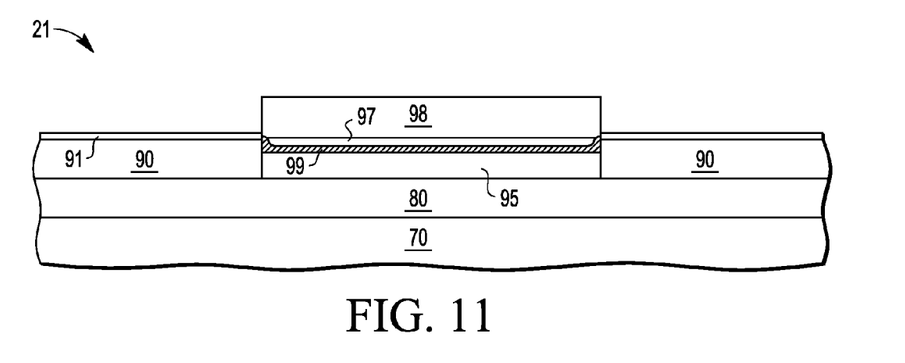
FIG. 11 illustrates processing subsequent to FIG. 10 after selectively removing the pad nitride mask layer.

FIG. 11 illustrates processing of the semiconductor wafer structure 21 subsequent to FIG. 10 after selectively removing the pad nitride mask layer 92. While any desired removal process may be used, an isotropic or wet etch process may be employed by using any a silicon nitride etch chemistry, such as a hot phosphoric acid ($H_3PO_4$) solution or another appropriate selective etchant to remove the nitride mask layer 92 while leaving in place the oxide polish stop or pad layers 91 and the remaining portions of the additional dielectric layer 98, protective insulator layer 97, and densified SiN hardcap encapsulation layer 99. By controlling the profile of the remnant or etched SiN encapsulation layer 99 so that its top surface is below the level of the pad nitride mask layer 92, the sides of the SiN encapsulation layer 99 are protected from the phosphoric acid strip process by the pad oxide layer 91.

Figure 12:
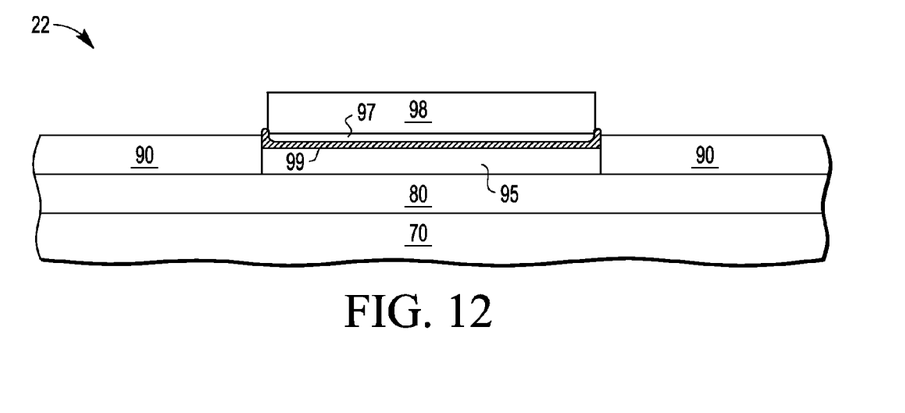
FIG. 12 illustrates processing subsequent to FIG. 11 after stripping the pad oxide layer.

FIG. 12 illustrates processing of the semiconductor wafer structure 22 subsequent to FIG. 11 after stripping the pad oxide layer 91, such as by employing an isotropic or wet etch process (e.g., HF acid solution) to remove the pad oxide layer 91. As shown in FIG. 12, if the pad oxide layer 91 is removed with an oxide etch chemistry, the remaining portions of the additional dielectric layer 98 will also be recessed or etched back, but the densified SiN hardcap encapsulation layer 99 should not be significantly affected, provided that the etch selectivity is controlled. The extent of recessing of the additional dielectric layer 98 may be controlled to allow for subsequent formation of silicon nitride spacers, as described hereinbelow. Once the pad oxide layer 91 is stripped, the wafer structure 22 may be cleaned with a hot phosphoric acid (H3PO4) solution. Though not shown, a substantially coplanar second active substrate layer having the same crystallographic orientation as the first semiconductor layer 70 may be formed by epitaxially growing and polishing the second active substrate layer in a second trench opening that is formed within the trench opening 94 to expose the first semiconductor layer 70 while retaining a surrounding or encircling portion of the STI region 95, densified SiN hardcap encapsulation layer 99, protective insulator layer 97, and additional dielectric layer 98.

Figure 13:
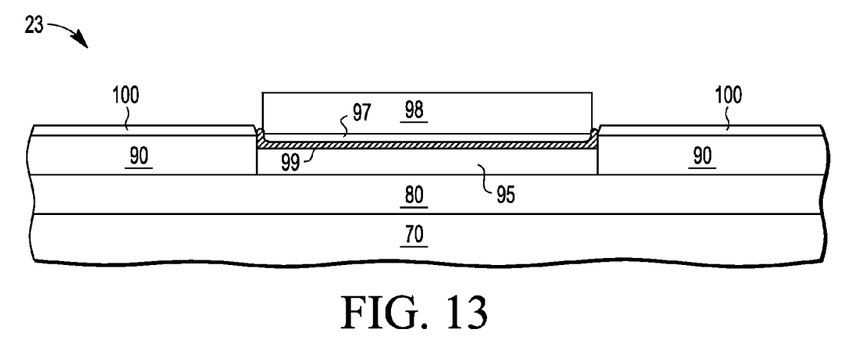
FIG. 13 illustrates processing subsequent to FIG. 12 after regrowing an oxide layer over the active SOI layers.

FIG. 13 illustrates processing of the semiconductor wafer structure 23 subsequent to FIG. 12 after forming a screen oxide layer 100 over at least the active SOI layers 90. In selected embodiments, the oxide layer 100 is formed to a predetermined thickness that is selected to provide a nitride etch stop property for the subsequently formed nitride spacers. The screen oxide layer 100 may be formed using any desired technique, such as PECVD, CVD, PVD, ALD, or the like, though as shown in FIG. 13, the screen oxide layer 100 may be thermally grown from the SOI semiconductor layer 90 to the predetermined thickness that provides the required etch stop function or property.

Figure 14:
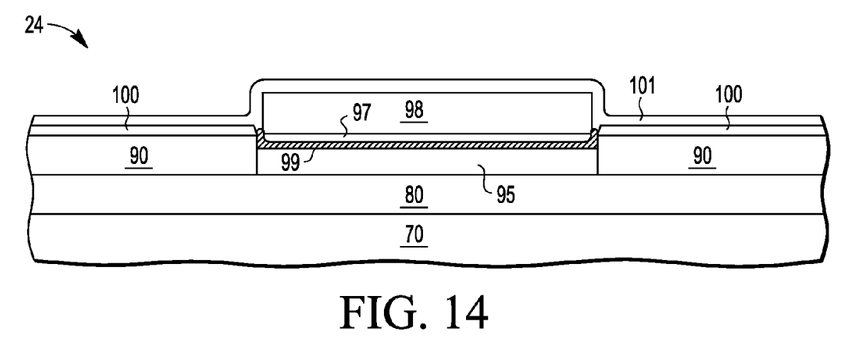
FIG. 14 illustrates processing subsequent to FIG. 13 after depositing a second silicon nitride layer.

FIG. 14 illustrates processing of the semiconductor wafer structure 24 subsequent to FIG. 13 after a second silicon nitride layer 101 is formed. The second silicon nitride layer 101 may be formed on the screen oxide layer 100 and exposed portions of the densified SiN hardcap encapsulation layer 99 and additional dielectric layer 98 using any desired technique, such as PECVD, CVD, PVD, ALD, or the like. In selected embodiments, the second silicon nitride layer 101 may be formed using a PECVD process to deposit an undensified or tensile silicon nitride layer 101 to a predetermined minimum thickness, such as approximately 100-200 Angstroms, and more particularly approximately 150 Angstroms, though other thicknesses can be used. Though not shown, it will be appreciated that a gap may be formed between the encapsulation layer 99 and the SOI semiconductor layer 90 by virtue of there being some portion of the initially deposited dielectric layer 95 that is not completely removed from the sidewalls (and in particular, the bottom corner areas) of the trench opening 94 shown in FIG. 4. In the case where the dielectric gap is formed between the encapsulation layer 99 and the SOI semiconductor layer 90, the second silicon layer 101 fills or covers the gap so that the subsequently formed nitride spacer will overlap the gap between the SiN layer 99 and the SOI semiconductor layer 90, thereby completing the encapsulation of the underlying STI region. By controlling the thickness and placement of the second silicon nitride layer 101, nitride spacers having a minimum predetermined width may be formed on the sidewalls of the densified SiN hardcap encapsulation layer 99 and additional dielectric layer 98.

Figure 15:
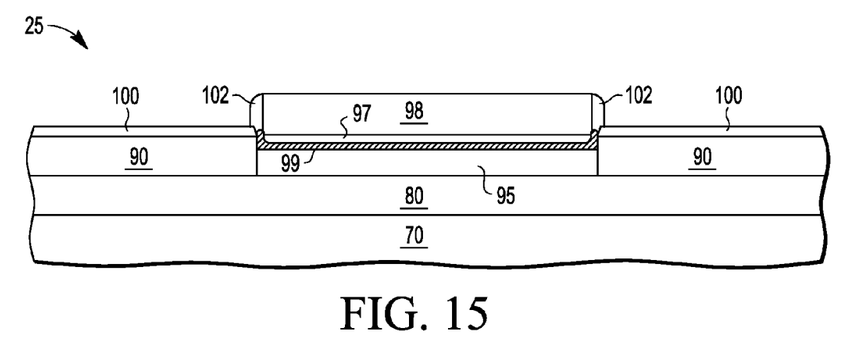
FIG. 15 illustrates processing subsequent to FIG. 14 after etching the second silicon nitride layer to form spacers which expose part of the active SOI layers.

FIG. 15 illustrates processing of the semiconductor wafer structure 25 subsequent to FIG. 14 after etching the second silicon nitride layer 101 to form nitride sidewall spacers 102 adjacent to the STI region 95 to protect the SiN hardcap encapsulation layer 99. As illustrated, the sidewall spacers 102 may be formed by anisotropically etching the second silicon nitride layer 101 down to the screen oxide layer 100 so that spacers 102 remain on the sides of the densified SiN hardcap encapsulation layer 99 and additional dielectric layer 98. One benefit of forming nitride sidewall spacers 102 is to allow the SiN hardcap encapsulation layer 99 to be located about the active SOI semiconductor layer 90 without risking undercutting by subsequent HF etch processing steps.

Figure 16:
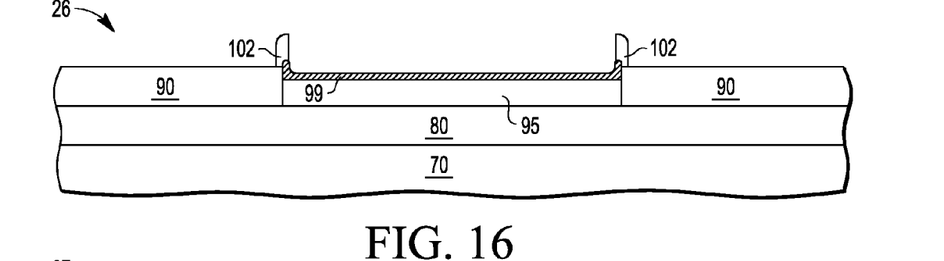
FIG. 16 illustrates processing subsequent to FIG. 15 after stripping any insulator material from the semiconductor wafer structure to leave the remaining densified first silicon nitride layer and part of the spacers.

FIG. 16 illustrates processing of the semiconductor wafer structure 26 subsequent to FIG. 15 after clearing the SOI semiconductor layer 90 for subsequent processing of the active device area. At this stage of manufacture, well-regions (not shown) may be formed by selectively implanting impurities through the screen oxide layer 100 and into the SOI semiconductor layer 90 in the exposed portions of the first semiconductor substrate layer 41 using an appropriate implant mask. For example, well regions may be formed by implanting impurities (e.g., arsenic or phosphorous or boron) with an implant energy of approximately 10-1000 keV and a dosage of approximately $1\times10^{11}$ to $1\times10^{14}$ cm$^{-2}$, though other implant species, energies, and dosages may be used. Before or after implanting the well regions, the screen oxide layer 100 and additional dielectric layer 98 are stripped from the semiconductor wafer structure 26 to leave the remaining densified silicon nitride layer 99 and part of the nitride sidewall spacers 102. When an isotropic or wet etch process, such as HF acid or another appropriate oxide etchant, is used to remove the screen oxide layer 100 and additional oxide layer 98, and the nitride sidewall spacers 102 and densified silicon nitride layer 99 are recessed or etched to a lesser extent.

Figure 17:
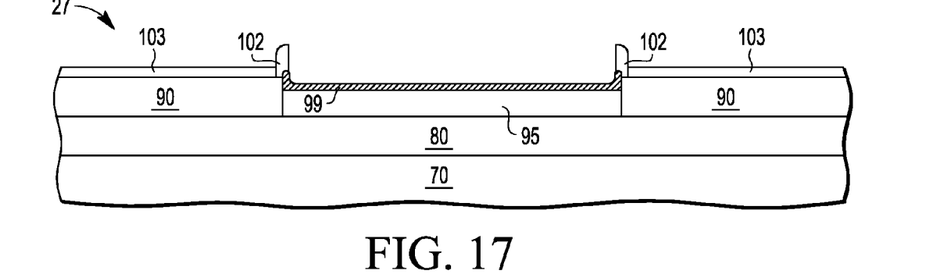
FIG. 17 illustrates processing subsequent to FIG. 16 after an epitaxial semiconductor layer is selectively formed over the exposed active SOI layers.

FIG. 17 illustrates processing of the semiconductor wafer structure 27 subsequent to FIG. 16 after an epitaxial semiconductor layer 103 is formed over the exposed active SOI layers 90 to a predetermined thickness. In selected embodiments, the epitaxial growth process is controlled so that at least the exposed active SOI layers 90 where PMOS devices will be formed are covered with a compressive silicon germanium layer 103. As will be appreciated, the SiGe layer 103 may be used to control the threshold voltage of the finally formed transistor devices. While either selective or non-selective epitaxial growth may be used to form the SiGe layers 103, in selected embodiments, selective epitaxial growth of the SiGe layer 103 may be achieved by a process of chemical vapor deposition (CVD) at a chamber temperature between 400 and 900° C. in the presence of dichlorosilane, germane (GeH$_4$), HCl, and hydrogen gas. As described herein and understood by those skilled in the art, the process of forming an epitaxial layer may be described as either depositing or growing a layer so that the "growth" and "deposition" terms are used interchangeably with respect to epitaxial formation. By selectively forming the epitaxial semiconductor layer 103 from the SOI semiconductor layer 90 so that the crystallographic orientation of the epi layer 103 is different from the crystallographic orientation of the first semiconductor layer 70, the mobility of the holes for subsequently formed PMOS devices formed on the epi layer 103 may be optimized with respect to the mobility of the electrons for NMOS devices that are subsequently formed on a second substrate that is epitaxially grown in a trench opening that exposes the first semiconductor layer 70. Thus, depending on the type of transistor device being fabricated, the epitaxial semiconductor layer 103 may be formed from any (doped or undoped) semiconductor material, such as Si, SiGe, SiC, SiGeC or combinations thereof, which is capable of being formed utilizing a selective epitaxial growth method.

In the example depicted in FIG. 17, the depicted wafer structure 27 includes two semiconductor substrates that are laterally displaced and isolated with respect to one another by the shallow trench isolation region 95, 99. In particular, the first semiconductor structure is formed with the SOI semiconductor layer 90 and epitaxial semiconductor layer 103 on the left side, and the second semiconductor structure is formed with the SOI semiconductor layer 90 and epitaxial semiconductor layer 103 on the right side. Though not shown, each semiconductor structure may include a body and/or well region. In addition, it will be appreciated that an additional semiconductor substrate (not shown) may be formed in whole or in part by epitaxially growing a semiconductor material from an opening in the STI region that exposes the underlying semiconductor substrate layer 70, and this additional semiconductor substrate may also have formed therein a body and/or well region. The body and well regions contain impurities such that one is a p-doped and one is an n-doped so that the region in which NMOS transistors are formed is p-doped, and the region in which PMOS transistors are formed is n-doped.

Figure 18:
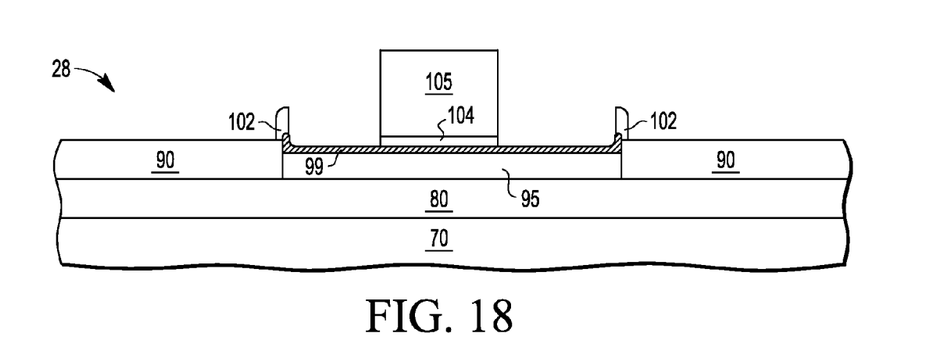
FIG. 18 illustrates processing subsequent to FIG. 17 after an etched gate electrode stack is formed perpendicular to the STI region.

Following the formation of encapsulated shallow trench isolation region 95, 99, one or more gate electrodes structures may be formed on the semiconductor wafer structure using any desired gate electrode formation sequence such that they overlap with the encapsulated STI region 95, 99. For example, FIG. 18 illustrates processing of the semiconductor wafer structure 28 subsequent to FIG. 17 after an etched gate electrode stack 104, 105 is formed perpendicular to the encapsulated STI region 95, 99. In an example sequence, at least a first high-k gate dielectric layer 104 is blanket deposited and/or grown across the entire wafer structure 28 and used to subsequently form the gate dielectric layers. The first high-k gate dielectric layer 104 may be used to form at least part of the gate dielectric for all transistors on the wafer, or alternatively, the first high-k gate dielectric layer 104 may be used for only a first type of transistor formed on the wafer. In selected embodiments, the first high-k gate dielectric layer 104 is deposited using CVD, PECVD, PVD, ALD, or any combination(s) of the above to a predetermined final thickness in the range of 1-100 Angstroms (e.g., 10-50 Angstroms, or more particularly, 15-20 Angstroms), though other thicknesses may be used. A suitable high-k gate dielectric material for the gate dielectric layer 104 is an insulator material having a dielectric constant value k greater than 7.0. For example, a metal oxide compound may be used that does not include silicon (e.g., HfO$_2$), though other oxides, silicates or aluminates of zirconium, aluminum, lanthanum, strontium, tantalum, titanium and combinations thereof may also be used, including but not limited to Ta$_2$O$_5$, ZrO$_2$, TiO$_2$, Al$_2$O$_3$, Y$_2$O$_3$, La$_2$O$_3$, HfSiN$_y$O$_x$, ZrSiN$_y$O$_x$, ZrHfO$_x$, LaSiO$_x$, YSiO$_x$, ScSiO$_x$, CeSiO$_x$, HfLaSiO$_x$, HfAlO$_x$, ZrAlO$_x$, and LaAlO$_x$. In addition, multi-metallic oxides (for example barium strontium titanate, BST) may also provide high-k dielectric properties. As will be appreciated, the high-k gate dielectric layer 104 may be formed in other ways in other embodiments.

After forming the high-k gate dielectric layer 104, one or more etched gate electrodes 105 are formed on the high-k gate dielectric layer 104 using any desired gate electrode formation sequence. For example, the gate electrodes 105 may be formed from at least a first conductive layer (e.g., polysilicon, SiGe and/or metal) by depositing or forming a first conductive layer having a predetermined thickness (e.g., in the range of 1-20 nanometers) over the high-k gate dielectric layer 104, and then forming a second polysilicon layer having a predetermined thickness (e.g., in the range of 20-100 nanometers) to form a first metal gate stack. Once the first gate stack is formed, any desired gate electrode etch processing steps may be used to form the desired gate electrode 105 over the high-k gate dielectric layer 104. In the depicted example, the etched gate electrode stack 104, 105 is formed to be perpendicular to the encapsulated STI region 95, 99. Given the proximity of shallow trench isolation region 95 to the overlapping portions of the etched gate electrodes structures 104, 105, the densified SiN encapsulation layer 99 provides a barrier to oxygen diffusion that would adversely affect the formation of the high-k gate dielectric layer 104.

Figure 19:
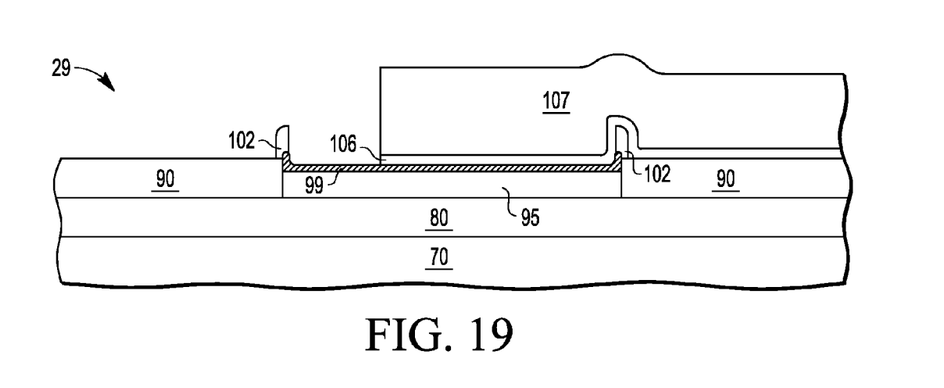
FIG. 19 illustrates processing subsequent to FIG. 17 after an etched gate electrode stack is formed parallel to the STI region.

In another example depicted in FIG. 19, processing of the semiconductor wafer structure 29 subsequent to FIG. 17 is illustrated after an etched gate electrode stack 106, 107 is formed parallel to the encapsulated STI region 95, 99. In this example, at least a first high-k gate dielectric layer 106 is formed or deposited over the semiconductor wafer structure 29, followed by formation or deposition of one or more gate electrode layers (e.g., metal and poly layers) that are selectively etched to form the etched gate electrodes 107. In the depicted example, the etched gate electrode stack 106, 107 is formed to be parallel to and overlapping with the encapsulated STI region 95, 99. Again, in this configuration, the densified SiN encapsulation layer 99 provides a barrier to oxygen diffusion that would adversely affect the formation of the high-k gate dielectric layer 106.

It will be appreciated that additional processing steps will be used to complete the fabrication of gate electrode structures into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

By now it should be appreciated that there has been disclosed herein a method for fabricating a semiconductor structure having a shallow trench isolation region or structure and a silicon nitride encapsulation layer formed over the shallow trench isolation region/structure. As disclosed, a shallow trench opening is formed in a semiconductor layer which may, but need not necessarily, be a second semiconductor layer formed over a first semiconductor layer and buried isolation layer. The shallow trench opening may be formed by providing first and second semiconductor layers (where the second semiconductor layer separated from the underlying first semiconductor layer by an insulator layer); forming a first oxide layer over the second semiconductor layer; forming a mask layer over the first oxide layer; and selectively removing a portion of the mask layer, first oxide layer, second semiconductor layer to form the shallow trench opening in a first region and to leave a remaining portion of the mask layer, first oxide layer, and second semiconductor layer in a second region. Once the shallow trench opening is formed, it may be filled at least in part with a first dielectric material to form a shallow trench isolation region, such as by depositing a first layer of high density plasma oxide. At this point, an isotropic etch process may be applied to remove a portion of the first layer of high density plasma oxide that is formed on an upper vertical sidewall of the shallow trench opening while leaving at least part of the shallow trench isolation region at the bottom of the shallow trench opening. A silicon nitride layer is then formed to cover the shallow trench isolation region, such as by using a plasma-enhanced chemical vapor deposition (PECVD) process to deposit a tensile silicon nitride layer to a predetermined minimum thickness on the shallow trench isolation region. On the silicon nitride layer, a second dielectric material (e.g., high density plasma oxide) is deposited to form a protective dielectric layer. At this point, an isotropic etch process may be applied to remove a portion of the protective dielectric layer that is formed on an upper vertical sidewall of the shallow trench opening while leaving at least part of the silicon nitride encapsulation layer and shallow trench isolation region at the bottom of the shallow trench opening. By polishing the protective dielectric layer (e.g., with a chemical mechanical polish step) and applying a thermal densification process, the silicon nitride layer is densified to thereby form a silicon nitride encapsulation layer over the shallow trench isolation region. In selected embodiments, the protective dielectric layer is polished to form a polished protective dielectric layer, followed by etching the polished protective dielectric layer while removing a pad oxide layer from the semiconductor layer to form a recessed protective dielectric layer, and then forming silicon nitride sidewall spacers adjacent to sidewall surfaces of the recessed protective dielectric layer to protect the silicon nitride encapsulation layer and shallow trench isolation region. Finally, one or more gate electrode structures may be formed that overlap at least in part with the silicon nitride encapsulation layer and shallow trench isolation region, said one or more gate electrode structures comprising at least a first high-k dielectric gate layer and a conductive layer.

In another form, there is provided a trench isolation region and associated process for forming same. As disclosed, a semiconductor substrate structure is provided that includes a semiconductor layer. A nitride layer is formed over the semiconductor substrate structure which is patterned to selectively form a first opening in the nitride layer that exposes part of the semiconductor layer. The first opening in the nitride layer is used to define an etch mask for selectively etching a second opening in the semiconductor layer, where the first and second openings together form a trench opening. At least part of the trench opening is filled with an oxide layer, such as by depositing a high density plasma oxide layer in the trench opening that is thicker on the bottom of the trench opening than the vertical surface or sidewalls of the trench opening. Subsequently, the high density plasma oxide layer on the upper portion of the vertical surface region of the trench opening is selectively removed while leaving at least a portion of the high density plasma oxide layer on the bottom surface region of the trench opening. A first nitride layer is then deposited on the oxide layer to completely cover the oxide layer, such as by using a PECVD process to deposit a tensile silicon nitride layer to a predetermined minimum thickness. On the first nitride layer, a first protective oxide layer is deposited that is thicker on a bottom surface region of the trench opening than a vertical surface region of the trench opening. The portions of the first protective oxide and first nitride layer are selectively removed from an upper portion of the vertical surface region of the trench opening while substantially leaving the first protective oxide and first nitride layer on the bottom surface region of the trench opening, and then a second oxide layer is deposited to fill the trench opening. The deposited second oxide layer is then polished with a chemical mechanical polish process to remove at least a portion of the second oxide layer and the first nitride layer is densified, thereby forming a trench isolation region having a densified nitride encapsulation layer. In selected embodiments, one or more gate electrode structures may be formed that overlap at least in part with the trench isolation region and densified nitride encapsulation layer, where the gate electrode structures are formed with at least a first high-k dielectric gate layer and a conductive layer. After polishing the deposited second oxide layer, any remaining portion of the nitride layer may be selectively removed to expose any remaining portion of the semiconductor layer and to leave a remnant portion of the first protective oxide layer and densified first nitride layer formed over the oxide layer. On the remnant portion, a second nitride layer is deposited to cover the top and sides of the remnant portion, and then anisotropically etched to form nitride sidewall spacers adjacent to sidewall surfaces of the remnant portion to protect the trench isolation region and densified nitride encapsulation layer. Prior to depositing the second nitride layer, an oxide polish stop layer may then be regrown on any remaining portion of the semiconductor layer. To expose the remaining portion of the semiconductor layer, nitride sidewall spacers, and densified nitride encapsulation layer formed over the trench isolation region, any portion of the oxide polish stop layer, first protective oxide layer, and second oxide layer are selectively removed.

In yet another form, there is provided a method for fabricating semiconductor devices. In the disclosed methodology, a semiconductor wafer structure is provided that includes a relatively thick mask layer formed over a relatively thin oxide layer, an SOI semiconductor layer and an underlying first semiconductor layer, where the SOI semiconductor layer and first semiconductor layer are separated by a buried insulator layer. The buried insulator layer is exposed in a first area by forming a trench opening in the SOI semiconductor layer. A first layer of high density plasma oxide is deposited to fill the trench opening to form a trench isolation structure that is substantially as thick as the SOI semiconductor layer. A tensile silicon nitride layer is deposited on the first layer of high density plasma oxide, followed by deposition of a second layer of high density plasma oxide on the tensile silicon nitride layer, where the second layer of high density plasma oxide is thicker on a bottom surface region of the trench opening than a vertical surface region of the trench opening. Any portion of the second layer of high density plasma oxide and tensile silicon nitride layer is selectively removed from an upper portion of the vertical surface region of the trench opening while leaving at least a portion of the second layer of high density plasma oxide and tensile nitride layer at the bottom surface region of the trench opening. A third layer of high density plasma oxide is then deposited to fill the trench opening, the third layer of high density plasma oxide is then polished with a chemical mechanical polish process to remove at least a portion of the third layer of high density plasma oxide, and the tensile nitride layer is densified, thereby forming a trench isolation structure having a densified nitride encapsulation layer. Finally, one or more gate electrode structures are formed that overlap at least in part with the trench isolation structure and densified nitride encapsulation layer, where the gate electrode structures include at least a first high-k dielectric gate layer and a conductive layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:
    forming a shallow trench opening in a semiconductor layer;
    filling at least part of the shallow trench opening with a first dielectric material to form a shallow trench isolation structure;
    forming a silicon nitride layer to cover the shallow trench isolation structure;
    depositing a second dielectric material over the silicon nitride layer to form a protective dielectric layer; and
    polishing the protective dielectric layer and densifying the silicon nitride layer, thereby forming a silicon nitride encapsulation layer over the shallow trench isolation structure.

2. The method of claim 1, where forming the shallow trench opening in the semiconductor layer comprises forming a shallow trench opening in a second semiconductor layer by:
    providing a first semiconductor layer and a second semiconductor layer over at least part of the first semiconductor layer, where the second semiconductor layer is separated from the first semiconductor layer by an insulator layer;
    forming a first oxide layer over the second semiconductor layer;
    forming a mask layer over the first oxide layer;
    selectively removing a portion of the mask layer, first oxide layer, second semiconductor layer to form the shallow trench opening in the second semiconductor layer in a first region and to leave a remaining portion of the mask layer, first oxide layer, and second semiconductor layer in a second region.

3. The method of claim 1, where filling at least part of the shallow trench opening comprises depositing a first layer of high density plasma oxide.

4. The method of claim 3, further comprising isotropically etching a portion of the first layer of high density plasma oxide that is formed on an upper vertical sidewall of the shallow trench opening while leaving at least a portion of the high density plasma oxide on a bottom surface of the shallow trench opening.

5. The method of claim 1, where forming the silicon nitride layer comprises using a plasma-enhanced chemical vapor deposition (PECVD) process to deposit a tensile silicon nitride layer to a predetermined minimum thickness on the shallow trench isolation structure.

6. The method of claim 1, where depositing the second dielectric material comprises depositing a second layer of high density plasma oxide to form the protective dielectric layer.

7. The method of claim 6, further comprising isotropically etching a portion of the protective dielectric layer that is formed on an upper vertical sidewall of the shallow trench opening while leaving at least a portion of the silicon nitride encapsulation layer and shallow trench isolation structure at a bottom surface of the shallow trench opening.

8. The method of claim 1, where polishing the protective dielectric layer comprises applying a chemical mechanical polish step.

9. The method of claim 1, where polishing the protective dielectric layer and densifying the silicon nitride layer comprises polishing the protective dielectric layer to form a polished protective dielectric layer, the method further comprising:
etching the polished protective dielectric layer while removing a pad oxide layer from the semiconductor layer to form a recessed protective dielectric layer; and
forming silicon nitride sidewall spacers adjacent to sidewall surfaces of the recessed protective dielectric layer to protect the silicon nitride encapsulation layer and shallow trench isolation structure.

10. The method of claim 1, further comprising:
forming one or more gate electrode structures that overlap at least in part with the silicon nitride encapsulation layer and shallow trench isolation structure, said one or more gate electrode structures comprising at least a first high-k dielectric gate layer and a conductive layer.

11. A process of forming a trench isolation region, comprising:
providing a semiconductor substrate structure comprising a semiconductor layer;
forming a nitride layer over the semiconductor substrate structure;
selectively forming a first opening in the nitride layer to expose part of the semiconductor layer;
etching a second opening in the semiconductor layer using the first opening in the nitride layer to define an etch mask, where the first and second openings together form a trench opening;
filling at least part of the trench opening with an oxide layer;
depositing a first nitride layer on the oxide layer to completely cover the oxide layer;
depositing a first protective oxide layer on the first nitride layer, where the first protective oxide layer is thicker on a bottom surface region of the trench opening than a vertical surface region of the trench opening;
selectively removing any portion of the first protective oxide and first nitride layer from an upper portion of the vertical surface region of the trench opening while leaving at least a portion of the first protective oxide and first nitride layer at a bottom surface region of the trench opening;
depositing a second oxide layer to fill the trench opening;
polishing the second oxide layer with a chemical mechanical polish process to remove at least a portion of the second oxide layer; and
densifying the first nitride layer, thereby forming a trench isolation region having a densified nitride encapsulation layer.

12. The process of claim 11, where filling at least part of the trench opening comprises:
depositing a first layer of high density plasma oxide in the trench opening, where the first layer of high density plasma oxide is thicker on a bottom surface region of the trench opening than a vertical surface region of the trench opening; and
removing any portion of the first layer of high density plasma oxide from an upper portion of the vertical surface region of the trench opening while leaving at least a portion of the first layer of high density plasma oxide on the bottom surface region of the trench opening.

13. The process of claim 11, where depositing the first nitride layer comprises using a plasma-enhanced chemical vapor deposition (PECVD) process to deposit a tensile silicon nitride layer to a predetermined minimum thickness.

14. The process of claim 11, further comprising selectively removing any remaining portion of the nitride layer after polishing the second oxide layer, thereby exposing any remaining portion of the semiconductor layer and leaving a remnant portion of the first protective oxide layer and densified nitride encapsulation layer formed over the oxide layer.

15. The process of claim 14, further comprising:
depositing a second nitride layer to cover top and sides of the remnant portion;
anisotropically etching the second nitride layer to form nitride sidewall spacers adjacent to sidewall surfaces of the remnant portion to protect the trench isolation region and densified nitride encapsulation layer.

16. The process of claim 15, further comprising regrowing an oxide polish stop layer on a remaining portion of the semiconductor layer prior to depositing the second nitride layer.

17. The process of claim 16, further comprising selectively removing any portion of the oxide polish stop layer, first protective oxide layer, and second oxide layer to expose the remaining portion of the semiconductor layer, nitride sidewall spacers, and densified nitride encapsulation layer formed over the trench isolation region.

18. The process of claim 11, further comprising forming one or more gate electrode structures that overlap at least in part with the trench isolation region and densified nitride encapsulation layer, said one or more gate electrode structures comprising at least a first high-k dielectric gate layer and a conductive layer.

19. A method for fabricating semiconductor devices, comprising:
providing a semiconductor wafer structure in which a relatively thick mask layer is formed over a relatively thin oxide layer, an SOI semiconductor layer and an underlying first semiconductor layer, where the SOI semiconductor layer and first semiconductor layer are separated by a buried insulator layer;
exposing the buried insulator layer in a first area by forming a trench opening in the SOI semiconductor layer;
depositing a first layer of high density plasma oxide to fill the trench opening to form a trench isolation structure that is substantially as thick as the SOI semiconductor layer;
depositing a tensile silicon nitride layer on the first layer of high density plasma oxide;
depositing a second layer of high density plasma oxide on the tensile silicon nitride layer, where the second layer of high density plasma oxide is thicker on a bottom surface region of the trench opening than a vertical surface region of the trench opening;
removing any portion of the second layer of high density plasma oxide and tensile silicon nitride layer from an upper portion of the vertical surface region of the trench opening while leaving at least a portion of the second layer of high density plasma oxide and tensile nitride layer at a bottom surface region of the trench opening;

depositing a third layer of high density plasma oxide; and polishing the third layer of high density plasma oxide with a chemical mechanical polish process to remove at least a portion of the third layer of high density plasma oxide and densifying the tensile nitride layer, thereby forming a densified nitride encapsulation layer on the trench isolation structure.

20. The method of claim 19, further comprising forming one or more gate electrode structures that overlap at least in part with the trench isolation structure and densified nitride encapsulation layer, said one or more gate electrode structures comprising at least a first high-k dielectric gate layer and a conductive layer.

* * * * *